(12) United States Patent
Fujimura et al.

(10) Patent No.: US 6,486,612 B2
(45) Date of Patent: *Nov. 26, 2002

(54) CONTROL CIRCUIT AND METHOD FOR PROTECTING A PIEZOELECTRIC TRANSFORMER FROM AN OPEN STATE AND A SHORT-CIRCUITED STATE

(75) Inventors: Takeshi Fujimura, Tokyo (JP); Katsuyuki Ishikawa, Tokyo (JP); Masaaki Toyama, Tokyo (JP)

(73) Assignee: Taiheiyo Cement Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/423,902
(22) PCT Filed: May 21, 1998
(86) PCT No.: PCT/JP98/02231
§ 371 (c)(1),
(2), (4) Date: Nov. 16, 1999
(87) PCT Pub. No.: WO98/54934
PCT Pub. Date: Dec. 3, 1998

(65) Prior Publication Data
US 2002/0011804 A1 Jan. 31, 2002

(30) Foreign Application Priority Data
May 26, 1997 (JP) .............................. 9-135187

(51) Int. Cl.$^7$ .............................................. H05B 37/02
(52) U.S. Cl. .................. 315/225; 315/127; 315/276
(58) Field of Search ................................ 315/307, 291, 315/219, 127, 224, 225, 276

(56) References Cited

U.S. PATENT DOCUMENTS 5,654,605 A * 8/1997 Kawashima ................. 310/316
5,854,543 A * 12/1998 Satoh et al. ................. 315/307

FOREIGN PATENT DOCUMENTS

| DE | 3303374 A1 | 8/1984 |
|---|---|---|
| EP | 0 338 109 A1 | 10/1989 |
| EP | 0 608 061 A2 | 7/1994 |
| EP | 0 762 808 A2 | 3/1997 |
| JP | 55-133673 | 10/1980 |
| JP | 5-64436 | 3/1993 |
| JP | 08 033 350 | 2/1996 |
| JP | 08149850 | 6/1996 |

* cited by examiner

Primary Examiner—David Vu
(74) Attorney, Agent, or Firm—Burns, Doane, Swecker & Mathis, LLP

(57) ABSTRACT

In a piezoelectric transformer control circuit, when a load (2) is disconnected from a piezoelectric transformer (1) and changes to an open state, an output detection voltage (Vdet) becomes higher than a reference voltage (Vref2), and the output from a voltage comparator (10a) goes "Low". When the output of the piezoelectric transformer (1) is short-circuited to GND, the output detection voltage (Vdet) abruptly drops to almost "0" and becomes lower than a reference voltage (Vref3). The output from a voltage comparator (10b) goes "Low". A voltage-controlled oscillation circuit (6) detects the signal "Low" to stop the generation of the oscillation signal to a driving circuit (7) for driving the piezoelectric transformer (1).

20 Claims, 6 Drawing Sheets

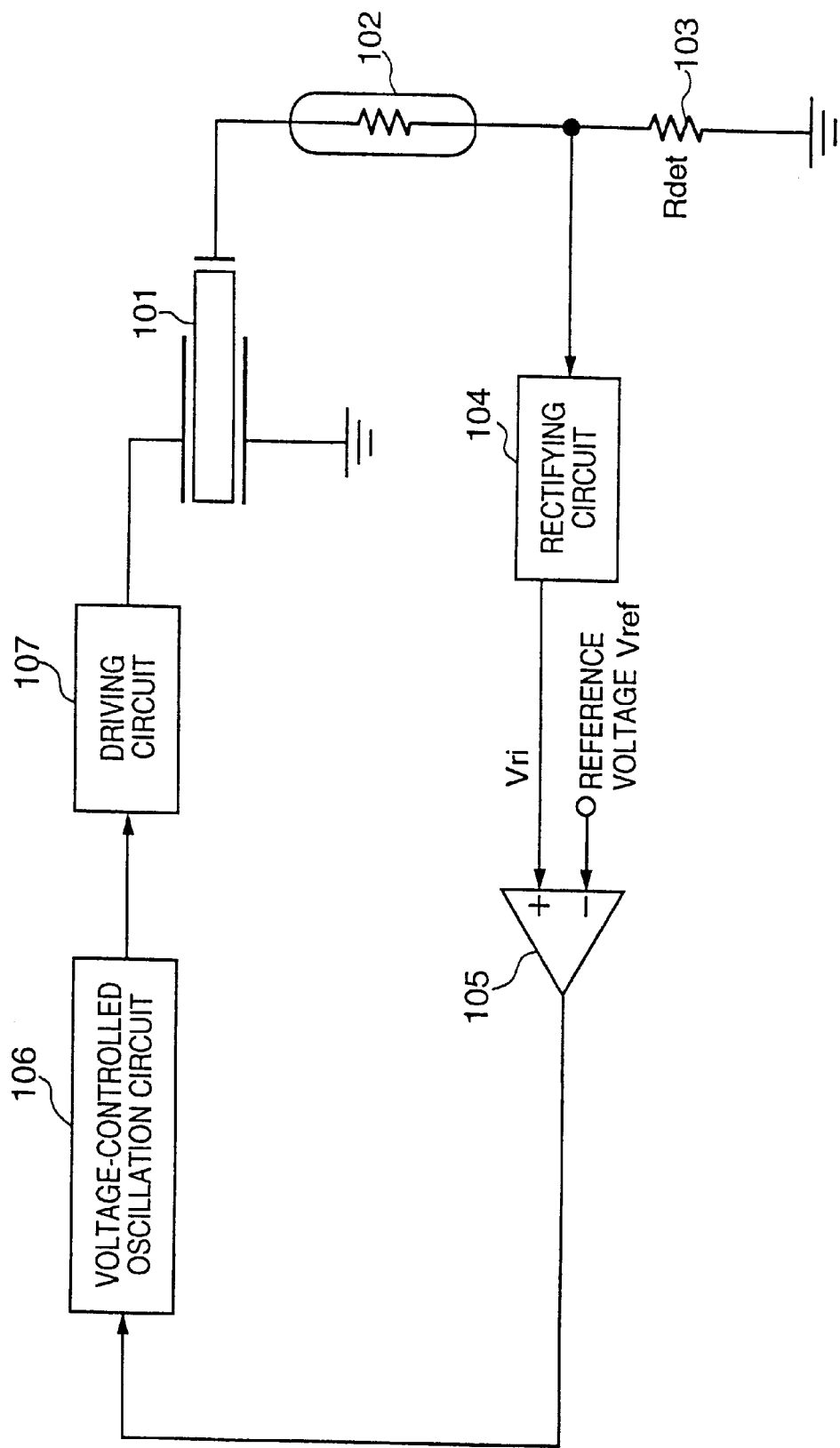

CONTROL CIRCUIT AND METHOD FOR PROTECTING A PIEZOELECTRIC TRANSFORMER FROM AN OPEN STATE AND A SHORT-CIRCUITED STATE

TECHNICAL FIELD

The present invention relates to a control circuit and method for a piezoelectric transformer and, more particularly, to a control circuit and method for a piezoelectric transformer suited for use in a driving apparatus for a cold-cathode fluorescent lamp.

BACKGROUND ART

Recently, liquid crystal displays are extensively used as display devices of, e.g., portable notebook personal computers. These liquid crystal display devices incorporate a cold-cathode fluorescent lamp as a so-called back light in order to illuminate a liquid crystal display panel from the back. Turning on this cold-cathode fluorescent lamp requires an inverter capable of converting a low DC voltage of a battery or the like into a high AC voltage of 1,000 Vrms or more in an initial lighting state and about 500 Vrms in a steady lighting state. Conventionally, a winding transformer is used as a boosting transformer of this inverter. In recent years, however, a piezoelectric transformer which performs electric conversion via mechanical energy and thereby performs boosting is beginning to be used. This piezoelectric transformer has a generally unpreferable characteristic, i.e., largely changes its boosting ratio in accordance with the magnitude of an output load (load resistance) such that the boosting ratio is high for a small output load (large load resistance) and is low for a large output load (small load resistance). On the other hand, this dependence upon a load resistance is suited to the characteristics of an inverter power supply for a cold-cathode fluorescent lamp. Accordingly, a piezoelectric transformer has attracted attention as a small-sized, high-voltage power supply meeting the demands for a low profile and a high efficiency of a liquid crystal display. An example of a control circuit for this piezoelectric transformer will be described below with reference to FIG. 1.

FIG. 1 is a block diagram of a piezoelectric transformer control circuit as the prior art.

In FIG. 1, reference numeral 101 denotes a piezoelectric transformer; 102, a load such as a cold-cathode fluorescent lamp connected to the output terminal of the piezoelectric transformer 101; 103, a detecting resistor Rdet for detecting a current flowing in the load; 104, a rectifying circuit for converting an AC voltage generated in the detecting resistor 103 into a DC voltage; 105, an error amplifier for comparing a voltage Vri rectified by the rectifying circuit 104 with a reference voltage Vref and amplifying the difference as a comparison result; 106, a voltage-controlled oscillation circuit for outputting an oscillation signal in accordance with the output voltage from the error amplifier 105; and 107, a driving circuit for driving the piezoelectric transformer 101 in accordance with the oscillation signal from the voltage-controlled oscillation circuit 106. The operation of the control circuit with the above configuration will be described below with reference to FIGS. 2A and 2B.

FIGS. 2A and 2B are graphs for explaining an example of frequency characteristics for the output voltage and load current of a piezoelectric transformer.

As shown in FIG. 2A, the piezoelectric transformer 101 has a hilly resonance frequency characteristic whose peak is the resonance frequency of the piezoelectric transformer 101. It is generally known that a current flowing in the load 102 due to the output voltage from the piezoelectric transformer 101 also has a similar hilly characteristic. In FIG. 2B, this load current is represented by a load current detection voltage Vri. Control using a right-side (falling) portion in this characteristic will be described below. When the power supply of this control circuit is turned on, the voltage-controlled oscillation circuit 106 starts oscillating at an initial frequency fa. Since no current flows in the load 102 at that time, the voltage generated in the detecting resistor (Rdet) 103 is zero. Accordingly, the error amplifier 105 outputs a negative voltage, as a result of comparison of the load current detection voltage Vri with the reference voltage Vref, to the voltage-controlled oscillation circuit 106. In accordance with this voltage, the voltage-controlled oscillation circuit 106 shifts the oscillation frequency of an oscillation signal to a lower frequency. Therefore, as the frequency is shifted to a lower frequency, the output voltage from the piezoelectric transformer 101 rises, and the load current (load current detection voltage Vri) also increases. When the load current (load current detection voltage Vri) become equal to the reference voltage Vref, the frequency stabilizes (fb). Even if the resonance frequency changes due to a temperature change or a change with time, the frequency shifts accordingly to always hold the load current substantially constant.

In the control circuit shown in FIG. 1, therefore, frequency control is so performed that the load current detection voltage Vri becomes equal to the reference voltage Vref, and the load current is held at a predetermined value by this frequency control. When a cold-cathode fluorescent lamp is used as a load in this piezoelectric transformer control circuit and the control circuit is used as a lighting device for the cold-cathode fluorescent lamp, a function of holding the luminance of the cold-cathode fluorescent lamp at a predetermined luminance can be achieved since the luminance of the cold-cathode fluorescent lamp is proportional to a lamp current flowing in the cold-cathode fluorescent lamp.

In this conventional piezoelectric transformer control circuit, however, when the load connected to the output terminal of the piezoelectric transformer is disconnected due to some reason, and the output terminal changes to a so-called open state, a high voltage is generated at the output terminal of the piezoelectric transformer in accordance with the open state.

At this time, if the frequency of the oscillation signal for driving the piezoelectric transformer does not vary, such a high voltage as to induce physical damage to the piezoelectric transformer is not generated because the operating point of the piezoelectric transformer shifts from the resonance frequency. However, when the output terminal of the piezoelectric transformer 101 actually changes to the open state, for example, the above control circuit shown in FIG. 1 detects that no current flows through the load current detecting resistor (Rdet) 103, and the oscillation frequency (operating point) of the voltage-controlled oscillation circuit 106 is swept to a lower frequency by the function of keeping the load current substantially constant. As a result, the operating point of the piezoelectric transformer 101 becomes equal to the resonance frequency to generate such a high voltage (10 kV or higher) as to physically damage the piezoelectric transformer 101 at the output terminal.

In the control circuit of FIG. 1, assume that the output of the piezoelectric transformer 101 is short-circuited to, e.g., ground (GND) (so-called grounding) due to some reason (note that the output may be short-circuited to a negative potential). Even in this state, if the frequency of the oscillation signal for driving the piezoelectric transformer 101 does not vary, no physical damage to the piezoelectric transformer 101 is induced. In practice, however, similar to the open state, when the control circuit detects that no current flows through the load current detecting resistor (Rdet) 103, the operating point of the piezoelectric transformer 101 is swept to a lower frequency by the voltage-controlled oscillation circuit 106 with the function of keeping the load current substantially constant, and the operating point of the piezoelectric transformer 101 may pass a resonance point (near the peaks in FIGS. 2A and 2B). Since the piezoelectric transformer 101 is in a series resonance state at a resonance frequency unique to the piezoelectric transformer, and the output of the piezoelectric transformer 101 is short-circuited to GND, the input impedance of the piezoelectric transformer 101 becomes very small. Accordingly, a large current may flow through the piezoelectric transformer 101 to physically damage it.

For example, Japanese Patent Publication No. 59-40313 and Japanese Patent Laid-Open No. 5-64436 disclose the technique of detecting the load current using a resistor to detect an increase in current caused by a short circuit. In these references, however, the short-circuiting state means a short circuit between the output terminals of a piezoelectric transformer connected to a load, and a short circuit between the output of the piezoelectric transformer and GND cannot be detected. In the control circuit disclosed in these references, when a short circuit occurs between the output terminals of the piezoelectric transformer connected to the load, the load current is detected, and the frequency is shifted to a higher frequency to prevent damage to the piezoelectric transformer.

DISCLOSURE OF INVENTION

It is an object of the present invention to provide a control circuit and method for a piezoelectric transformer in which damage to the piezoelectric transformer can be prevented upon occurrence of an abnormal state at the output of the piezoelectric transformer.

To achieve the above object, a piezoelectric transformer control circuit of the present invention has the following arrangement.

That is, a piezoelectric transformer control circuit having oscillation means for generating an oscillation signal in accordance with a control voltage, driving means for driving a piezoelectric transformer by an AC voltage generated in accordance with the oscillation signal from the oscillation means, and control means for detecting a load current of a load connected to an output side of the piezoelectric transformer and controlling an oscillation frequency of the oscillation means so as to keep the load current substantially constant, is characterized by comprising protective means for detecting an output voltage from the piezoelectric transformer and protecting the piezoelectric transformer on the basis of the output voltage.

For example, the protective means is characterized by comprising detecting means for detecting an open state or short-circuiting to ground on the output side of the piezoelectric transformer in accordance with a result of comparing the detected output voltage with a predetermined value. The protective means preferably stops generation of the oscillation signal by the oscillation means or sweeps a frequency of the oscillation signal by the oscillation means to a predetermined frequency so as to protect the piezoelectric transformer when the detecting means detects the open state or the short-circuiting to ground.

To achieve the above object, a piezoelectric transformer control method of the present invention has the following steps.

That is, a piezoelectric transformer control method of generating an oscillation signal in accordance with a control voltage, driving a piezoelectric transformer by an AC voltage generated in accordance with the oscillation signal, detecting a load current of a load connected to an output side of the piezoelectric transformer, and controlling an oscillation frequency so as to keep the load current substantially constant, is characterized by comprising the steps of detecting an output voltage from the piezoelectric transformer, and detecting an open state or short-circuiting to ground on the output side of the piezoelectric transformer in accordance with a result of comparing the detected output voltage with a predetermined value.

The method preferably further comprises stopping generation of the oscillation signal or sweeping a frequency of the oscillation signal to a predetermined frequency so as to protect the piezoelectric transformer when the open state or the short-circuiting to the ground is detected.

With the above arrangement and steps, damage to the piezoelectric transformer can be prevented upon occurrence of the open state or the short-circuiting to ground on the output side of the piezoelectric transformer.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

FIG. 1 is a block diagram of a piezoelectric transformer control circuit as the prior art;

BEST MODE FOR CARRYING OUT THE INVENTION

An embodiment of a piezoelectric transformer control circuit according to the present invention will be described below with reference to the accompanying drawings.

Figure 3:
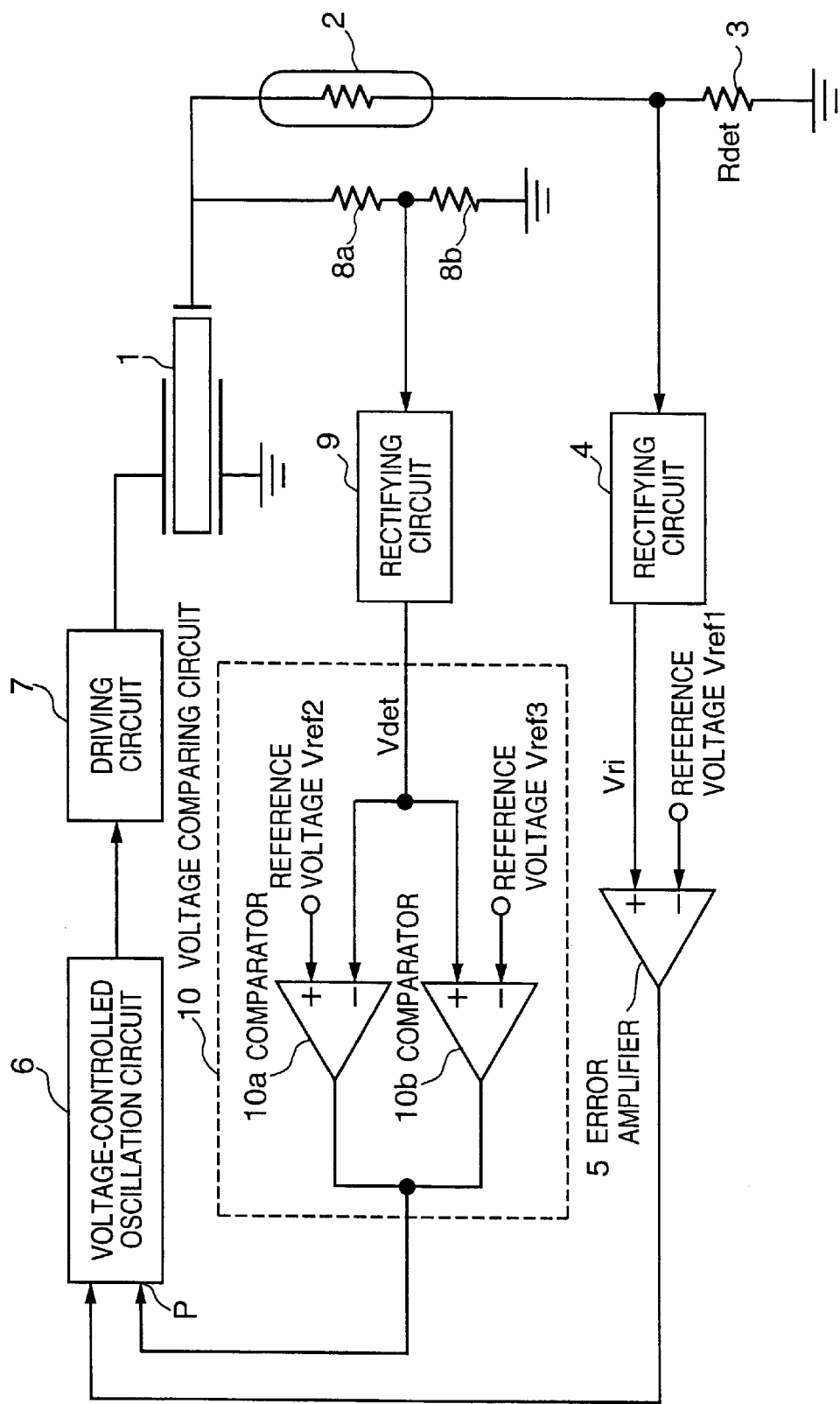
FIG. 3 is a block diagram of a piezoelectric transformer control circuit as an embodiment of the present invention.

FIG. 3 is a block diagram of a piezoelectric transformer control circuit as an embodiment of the present invention.

In FIG. 3, reference numeral 1 denotes a piezoelectric transformer; 2, a load such as a cold-cathode fluorescent lamp connected to the output terminal of the piezoelectric transformer 1; 3, a detecting resistor Rdet for detecting a current flowing in the load 2; 4, a rectifying circuit for converting an AC voltage generated in the detecting resistor 3 into a DC voltage; 5, an error amplifier for comparing a voltage Vri rectified by the rectifying circuit 4 with a reference voltage Vref and amplifying the difference as a comparison result; 6, a voltage-controlled oscillation circuit for outputting an oscillation signal in accordance with the output voltage from the error amplifier 5; and 7, a driving circuit for driving the piezoelectric transformer 1 in accordance with the oscillation signal from the voltage-controlled oscillation circuit 6.

Reference numerals 8a and 8b denote output voltage detecting resistors for dividing the output voltage from the piezoelectric transformer 1 by about 100 to 1,000 and detecting the output voltage from the divided voltage. The output voltage detecting resistors 8a and 8b have high resistances (several hundred kΩ to several MΩ) so as not to influence the output voltage from the piezoelectric transformer 1. Reference numeral 9 denotes a rectifying circuit for converting an AC detection voltage from the output voltage detecting resistors 8a and 8b into a DC voltage.

A voltage comparing circuit 10 is made up of comparators 10a and 10b wired-OR-connected to each other. The voltage comparing circuit 10 compares a detection voltage Vdet from the rectifying circuit 9 with reference voltages Vref2 and Vref3, and outputs a signal "High" or "Low" in accordance with the comparison results. In the voltage comparing circuit 10, if either of the outputs from the comparators 10a and 10b goes "Low", both the outputs from the voltage comparing circuit 10 go "Low" owing to the circuit characteristics.

Similar to the voltage-controlled oscillation circuit 106 in FIG. 1, the voltage-controlled oscillation circuit 6 outputs an oscillation signal to the driving circuit 7 in accordance with the output voltage from the error amplifier 5. The voltage-controlled oscillation circuit 6 comprises a strobe terminal P for stopping the oscillation of the voltage-controlled oscillation circuit 6. The arrangement and operation of the voltage-controlled oscillation circuit 6 will be described below.

Figure 4:
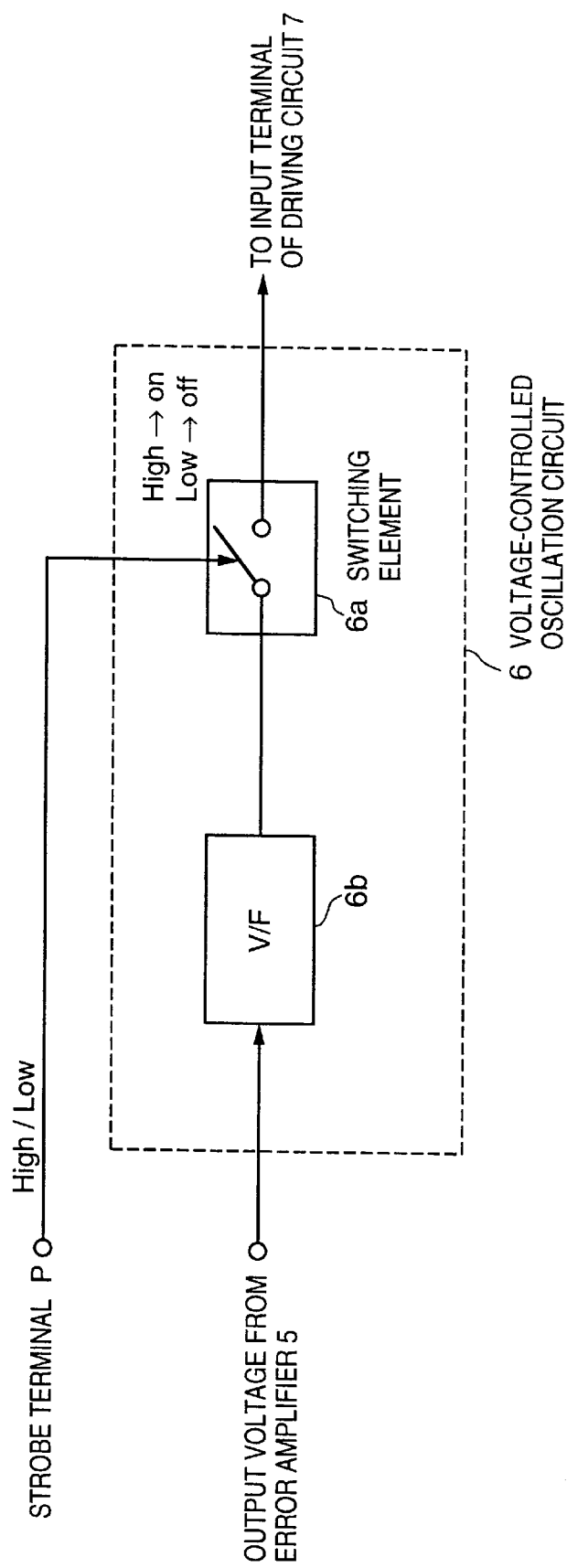
FIG. 4 is a circuit diagram showing the arrangement of a voltage-controlled oscillation circuit as the embodiment of the present invention.

FIG. 4 is a circuit diagram showing the arrangement of the voltage-controlled oscillation circuit as the embodiment of the present invention.

In FIG. 4, reference numeral 6b denotes a voltage/frequency (V/F) converter for converting the voltage into the frequency, which receives the output voltage from the error amplifier 5 as a control voltage; and 6a, a switching element for enabling/disabling the output of the V/F converter 6b in accordance with the state of a signal input to the strobe terminal P. In this embodiment, when a signal "High" is input to the strobe terminal P, a signal from the V/F converter 6b in accordance with the output voltage from the error amplifier 5 is output to the driving circuit 7 (to be referred to as a normal operation hereinafter). When a signal "Low" is input, no oscillation signal is output not to operate the driving circuit 7.

The operation of the control circuit of this embodiment having the above arrangement will be described with reference to FIG. 5.

Figure 5:
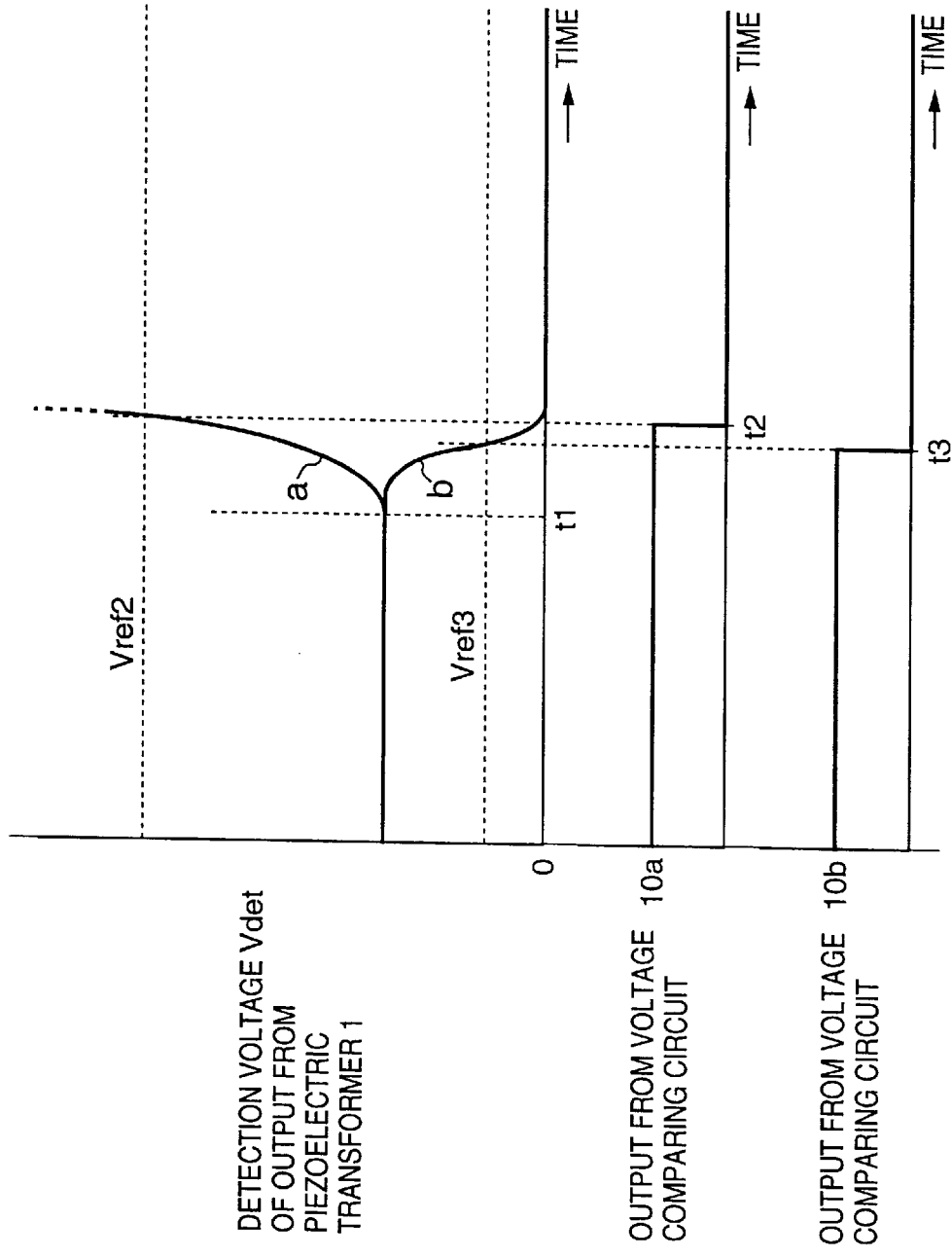
FIG. 5 is a timing chart for explaining the operation of the piezoelectric transformer control circuit as the embodiment of the present invention.

FIG. 5 is a timing chart for explaining the operation of the piezoelectric transformer control circuit as the embodiment of the present invention. When the piezoelectric transformer 1 performs a normal operation under the control of the load current, the output detection voltage Vdet is lower than the reference voltage Vref2 and higher than the reference voltage Vref3, as shown in FIG. 5. Therefore, both the outputs from the comparators 10a and 10b are at "High".

(Occurrence of Open State of Load 2)

Assume that the load 2 connected to the output terminal of the piezoelectric transformer 1 is disconnected at t1 in FIG. 5 during the normal operation, and changes to the open state. Then, as indicated by a curve (a) in FIG. 5, the output (output detection voltage Vdet) from the piezoelectric transformer 1 starts abruptly increasing in accordance with the open state of the load 2. When the output detection voltage Vdet becomes higher than the reference voltage Vref2 (t2), the output from the comparator 10a goes "Low" to stop the oscillation of the voltage-controlled oscillation circuit 6. Therefore, such a high voltage as to damage the piezoelectric transformer is not generated.

(Occurrence of Short-Circuiting of Output of Piezoelectric Transformer to GND)

When the output of the piezoelectric transformer 1 is short-circuited to GND at t1 in FIG. 5 during the normal operation, the output (output detection voltage Vdet) from the piezoelectric transformer 1 abruptly decreases to almost "0", as indicated by a curve (b) in FIG. 5. If the output detection voltage Vdet becomes lower than the reference voltage Vref3 (t3), the output from the comparator 10b goes "Low" to stop the oscillation of the voltage-controlled oscillation circuit 6. Accordingly, the problem described in "DESCRIPTION OF THE RELATED ART": "the piezoelectric transformer is driven in a resonance state because the operating point of the piezoelectric transformer is swept to a lower frequency by the voltage-controlled oscillation circuit" can be solved. The piezoelectric transformer 1 can be prevented from being damaged by a large current.

<Effect of Embodiment>

According to this embodiment, the output is determined to be in the open state if the output detection voltage Vdet is equal to or higher than the reference voltage Vref2, and to be short-circuited to GND if the voltage Vdet is equal to or lower than the reference voltage Vref3. The oscillation of the voltage-controlled oscillation circuit 6 is stopped. Therefore, when the output of the piezoelectric transformer 1 changes to the open state or is short-circuited to GND, the driving can be rapidly stopped based on a change in output voltage from the piezoelectric transformer 1, and physical damage to the piezoelectric transformer 1 can be prevented.

[Modification of Embodiment]

A modification of the above-mentioned embodiment will be described with reference to FIG. 6.

Figure 6:
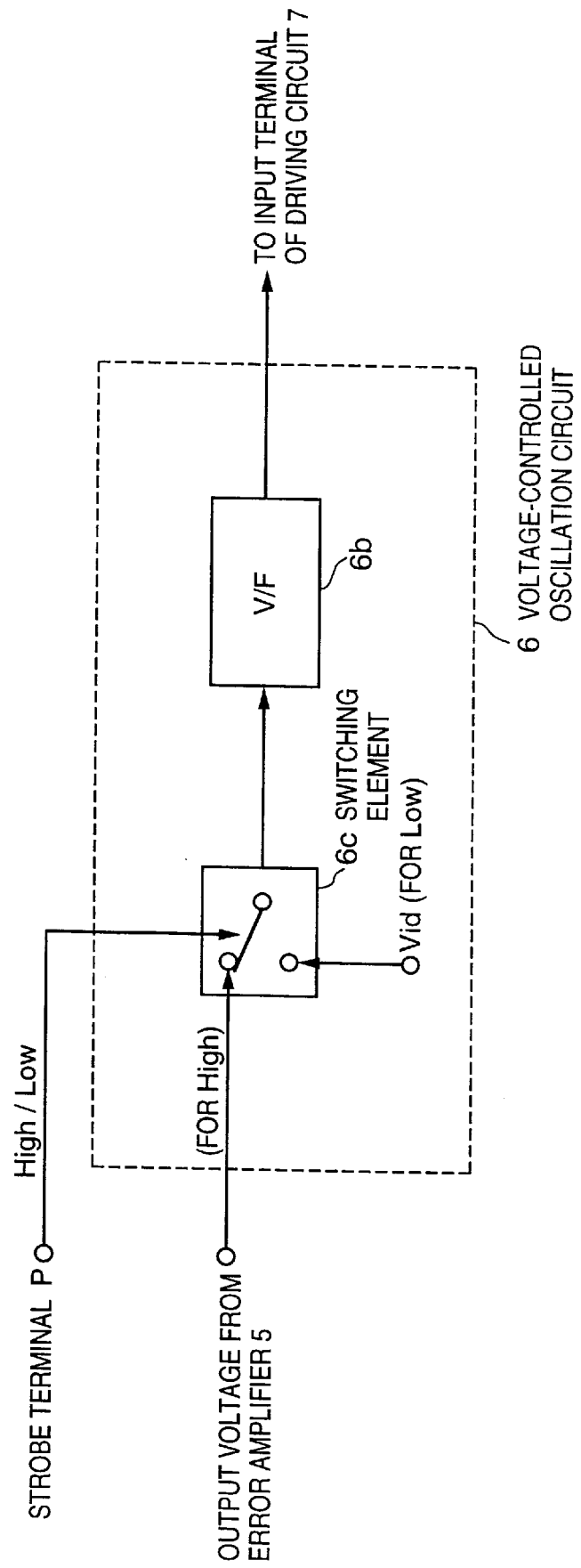
FIG. 6 is a circuit diagram showing the arrangement of the voltage-controlled oscillation circuit as a modification of the embodiment of the present invention.

FIG. 6 is a circuit diagram showing the arrangement of the voltage-controlled oscillation circuit as a modification of the embodiment of the present invention. The protective operation of the above embodiment can also be realized by the voltage-controlled oscillation circuit 6 having the arrangement shown in FIG. 6. The arrangement and operation of the voltage-controlled oscillation circuit 6 in this modification will be explained. The remaining arrangement except for the voltage-controlled oscillation circuit 6 is the same as in FIG. 3, and a description thereof will be omitted.

Figure 2A:
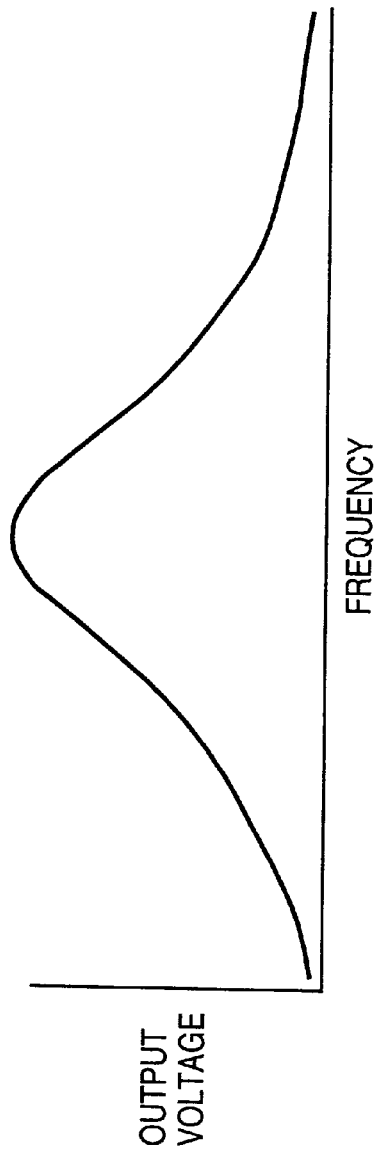
FIGS. 2A and 2B are graphs for explaining an example of frequency characteristics for the output voltage and load current of a piezoelectric transformer.
Figure 2B:
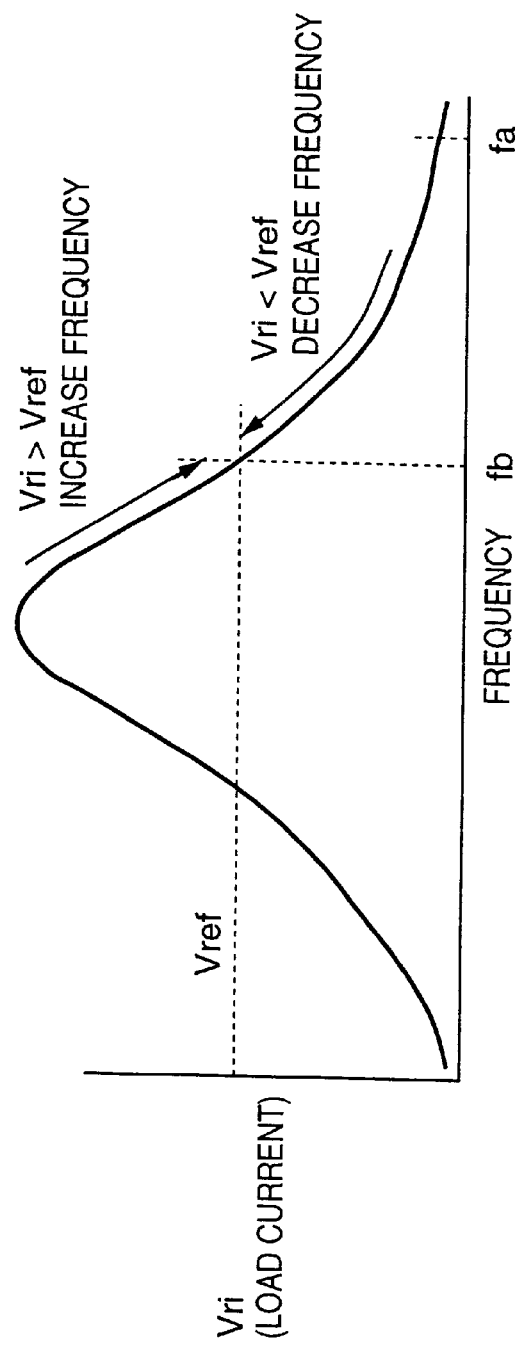

In FIG. 6, a switching element 6c receives the output voltage from the error amplifier 5 and a predetermined internal voltage Vid. In this case, the internal voltage Vid is set to a voltage value which causes the voltage-controlled oscillation circuit 6 to output an oscillation signal having the upper limit frequency (initial frequency: e.g., frequency fa in FIG. 2B) in resonance characteristics used by the control circuit for the control of the piezoelectric transformer 1.

These inputs are switched by the switching element 6c in accordance with the state of a signal input to the strobe terminal P, and output to the V/F converter 6b. In this modification, when a signal "High" is input to the strobe terminal P, the voltage-controlled oscillation circuit 6 outputs, to the driving circuit 7, a signal having a frequency in accordance with the output voltage from the error amplifier 5. To the contrary, when a signal "Low" is input to the strobe terminal P, the voltage-controlled oscillation circuit 6 outputs, to the driving circuit 7, a signal having a frequency in accordance with the internal voltage Vid, i.e., the upper limit frequency (initial frequency). That is, the oscillation signal output from the voltage-controlled oscillation circuit 6 is swept to the upper limit frequency.

(Occurrence of Open State of Load 2)

In this modification, if the output of the piezoelectric transformer 1 changes to the open state during the normal operation, and the output detection voltage Vdet becomes equal to or higher than the voltage Vref2, the output from the comparator 10a goes "Low". The signal "Low" is input to the strobe terminal P of the voltage-controlled oscillation circuit 6, and the voltage-controlled oscillation circuit 6 outputs a signal having the upper limit frequency to the driving circuit 7. That is, the oscillation signal output from the voltage-controlled oscillation circuit 6 is swept to the upper limit frequency. Therefore, even if the output of the piezoelectric transformer 1 is in the open state, such a high voltage as to damage the piezoelectric transformer 1 is not generated as far as the operating point of the piezoelectric transformer 1 is the upper limit frequency.

(Occurrence of Short-Circuiting of Output of Piezoelectric Transformer to GND)

When the output of the piezoelectric transformer is short-circuited to GND during the normal operation, and the output detection voltage Vdet becomes equal to or lower than the reference voltage Vref3, the output from the comparator 10b goes "Low". Similar to the occurrence of the open state, the frequency of the oscillation signal of the voltage-controlled oscillation circuit 6 is swept to a higher frequency (initial frequency). That is, the problem described in "DESCRIPTION OF THE RELATED ART": "the piezoelectric transformer is driven in a resonance state because the operating point of the piezoelectric transformer is swept to a lower frequency by the voltage-controlled oscillation circuit" can be solved. The piezoelectric transformer 1 can be prevented from being damaged by a large current.

In this modification, since the frequency of the oscillation signal is swept to a lower frequency by the voltage-controlled oscillation circuit 6, the piezoelectric transformer can obtain a unique effect of returning to the normal operation under the control of the load current so long as the piezoelectric transformer is temporarily in the open state or short-circuited to GND.

Note that the piezoelectric transformer control circuit of the above embodiment can be preferably used not only in driving a cold-cathode fluorescent lamp as a load but also in a display device using the cold-cathode fluorescent lamp. Also, when the piezoelectric transformer control circuit is used in a computer or a personal digital assistant including the display device, it is naturally possible to decrease the size and weight of the apparatus.

Additionally, when an ultraviolet lamp is driven by the piezoelectric transformer control circuit of the above embodiment, an object can be sterilized, deodorized, or decomposed by activation by ultraviolet rays irradiated by the lamp onto the object. That is, it is possible to provide, e.g., a sterilizing device or a water purification device using the ultraviolet lamp as a sterilization lamp or a deodorizing device using the ultraviolet lamp as a light source for exciting a catalyst.

Furthermore, the piezoelectric transformer control circuit of the above embodiment can be used in a high-voltage generator for driving an ozone generating device or a DC-DC converter.

As has been described above, according to the above embodiment, a control circuit and method for a piezoelectric transformer in which damage to the piezoelectric transformer can be prevented upon occurrence of an abnormal state at the output of the piezoelectric transformer can be provided.

As many apparently widely different embodiments of the present invention can be made without departing from the spirit and scope thereof, it is to be understood that the invention is not limited to the specific embodiments thereof except as defined in the appended claims.

What is claimed is:

1. A piezoelectric transformer control circuit comprising:
   oscillation means for generating an oscillation signal in accordance with a control voltage,
   driving means for driving a piezoelectric transformer by an AC voltage generated in accordance with the oscillation signal from said oscillation means,
   control means for detecting a load current of a load connected to an output side of said piezoelectric transformer and for controlling an oscillation frequency of said oscillation means so as to keep the load current substantially constant,
   first detecting means for detecting an output voltage from said piezoelectric transformer, and
   protective means including second detecting means for detecting an open state and a short-circuiting to ground on an output side of said piezoelectric transformer based on comparing the detected output voltage with first and second predetermined values, so that said protective means controls the oscillation signal generated by said oscillation means in response to the comparison.

2. The circuit according to claim 1, wherein said protective means detects the output voltage from said piezoelectric transformer, and when the detected output voltage rises to be higher than the first predetermined value, which is greater than the second predetermined value, in accordance with the open state on the output side of said piezoelectric transformer, stops generation of the oscillation signal from said oscillation means.

3. The circuit according to claim 1, wherein said protective means detects the output voltage from said piezoelectric transformer, and when the detected output voltage drops to be lower than the second predetermined value, which is smaller than the first predetermined value, in accordance with the short-circuiting to ground on the output side of said piezoelectric transformer, stops generation of the oscillation signal from said oscillation means.

4. The circuit according to claim 1, wherein said protective means sweeps a frequency of the oscillation signal of said oscillation means to a predetermined frequency so as to protect said piezoelectric transformer when said protective means detects the open state or the short-circuiting to ground.

5. The circuit according to claim 1, wherein said protective means detects the output voltage from said piezoelectric transformer, and when the detected output voltage rises to be higher than the first predetermined value, which is greater than the second predetermined value, in accordance with the open state on the output side of said piezoelectric transformer, sweeps a frequency of the oscillation signal from said oscillation means to a predetermined frequency.

6. The circuit according to claim 1, wherein said protective means detects the output voltage from said piezoelectric transformer, and when the detected output voltage drops to be lower than the second predetermined value, which is smaller than the first predetermined value, in accordance with the short-circuiting to ground on the output side of said piezoelectric transformer, sweeps a frequency of the oscillation signal from said oscillation means to a predetermined frequency.

7. The circuit according claim 4, wherein the predetermined frequency is an upper limit frequency in a resonance characteristic of said piezoelectric transformer used by said control means.

8. The circuit according to claim 1, wherein said control circuit is used in a driving apparatus for a cold-cathode fluorescent lamp as said load.

9. The circuit according to claim 1, wherein said control circuit is used in a driving apparatus for an ultraviolet lamp as said load.

10. A display device wherein a cold-cathode fluorescent lamp as a load is controlled by a piezoelectric transformer which is controlled by the circuit according to claim 1.

11. A computer comprising the display device according to claim 10 as display means.

12. A personal digital assistant comprising the display device according to claim 10 as display means.

13. A deodorizing device comprising the ultraviolet lamp according to claim 9 as a light source for exciting a catalyst.

14. A sterilizing device comprising the ultraviolet lamp according to claim 9 as a sterilization lamp.

15. A water purification device comprising the ultraviolet lamp according to claim 11 as a sterilization lamp.

16. The circuit according to claim 1, wherein said control circuit is used in a high-voltage generator for an ozone generating device as said load.

17. The circuit according to claim 1, wherein said control circuit is used in a DC-DC converter.

18. A piezoelectric transformer control method of generating an oscillation signal in accordance with a control voltage, driving a piezoelectric transformer by an AC voltage generated in accordance with the oscillation signal, detecting a load current of a load connected to an output side of said piezoelectric transformer, and controlling an oscillation frequency so as to keep the load current substantially constant, comprising the steps of:

detecting an output voltage from said piezoelectric transformer;

detecting an open state and short-circuiting to ground on the output side of said piezoelectric transformer based upon comparing the detected output voltage with first and second predetermined values; and controlling the oscillation signal in response to the comparison.

19. The method according to claim 18, further comprising the step of stopping generation of the oscillation signal so as to protect said piezoelectric transformer when the open state or the short-circuiting to ground state is detected.

20. The method according to claim 18, further comprising the step of sweeping a frequency of the oscillation signal to the predetermined frequency so as to protect said piezoelectric transformer when the open state or the short-circuiting to ground state is detected.

* * * * *